United States Patent [19]
Lerch

[11] 3,715,603
[45] Feb. 6, 1973

[54] THRESHOLD GATE CIRCUITS EMPLOYING FIELD-EFFECT TRANSISTORS

[75] Inventor: Joseph B. Lerch, North Brunswick, N.J.

[73] Assignee: RCA Corporation

[22] Filed: Oct. 28, 1971

[21] Appl. No.: 193,519

[52] U.S. Cl. ....................307/211, 307/205, 307/215
[51] Int. Cl. ..............................................H03k 19/42
[58] Field of Search ...........307/211, 214, 205, 221 C

[56] References Cited

UNITED STATES PATENTS

| | | | |
|---|---|---|---|
| 3,449,594 | 6/1969 | Gibson et al. | 307/251 |
| 3,275,812 | 9/1966 | Coates et al. | 307/211 X |
| 3,322,974 | 5/1967 | Ahrons et al. | 307/221 C |
| 3,519,941 | 7/1970 | Winder | 307/211 X |

OTHER PUBLICATIONS

RCA Technical Notes No. 676, June, 1966, "Complementary Fet Logic Gate" by Rapp
IBM Tech. Disclosure Bulletin Vol. 7, No. 2 7/64 PP. 168, 169 Fet Nor Circuit by Axelrod

*Primary Examiner*—John S. Heyman
*Attorney*—H. Christoffersen

[57] ABSTRACT

A threshold gate comprising a plurality of complementary-symmetry, field-effect transistor inverters, each inverter receiving at its common gate connection a different input signal and each connected at its output terminal to a common circuit output terminal. The gate may have inputs all of the same weight or, with appropriately chosen values of transistor conduction channel impedance or parallel connected inverters, may have inputs of different weight.

5 Claims, 3 Drawing Figures

THRESHOLD GATE CIRCUITS EMPLOYING FIELD-EFFECT TRANSISTORS

STATEMENT

The invention described herein was made in the course of or under a contract or subcontract thereunder with the Department of the Navy.

BACKGROUND OF THE INVENTION

Many circuits are known for implementing threshold functions both of the weighted and non-weighted types. Some employ summing techniques in which a plurality of signals are applied to a common circuit point and an amplifier connected to that point determines whether the sum of the signals exceeds a given threshold voltage level. These often suffer from tolerance problems — the ability to distinguish between sum signals representing binary 1 and binary 0, respectively, especially where there are almost as many input signals representing 1's as 0's, and where noise is present. In addition, some circuits of this type employ input signal coupling elements which are not easily integratable.

A number of solutions have been proposed for the problem above which are implemented with bipolar transistors. While acceptable, these circuits are not easily interfaced with presently widely used field-effect transistor circuits such as those employing metal-oxide semiconductor (MOS) devices. The purpose of the present invention is to provide another solution to the problem, one which is compatible with the field-effect transistor technology.

SUMMARY OF THE INVENTION

A plurality of complementary-symmetry, field-effect transistor inverter circuits, each receiving a different input signal, and all connected at their output terminal to a common circuit output terminal. Different forms of the invention are suitable for implementing equal input-weight threshold functions and other embodiments for implementing weighted threshold gate functions.

BRIEF DESCRIPTION OF THE DRAWING

Similar reference characters identify similar components in the various figures.

DETAILED DESCRIPTION

Figures 1, 2, 3:
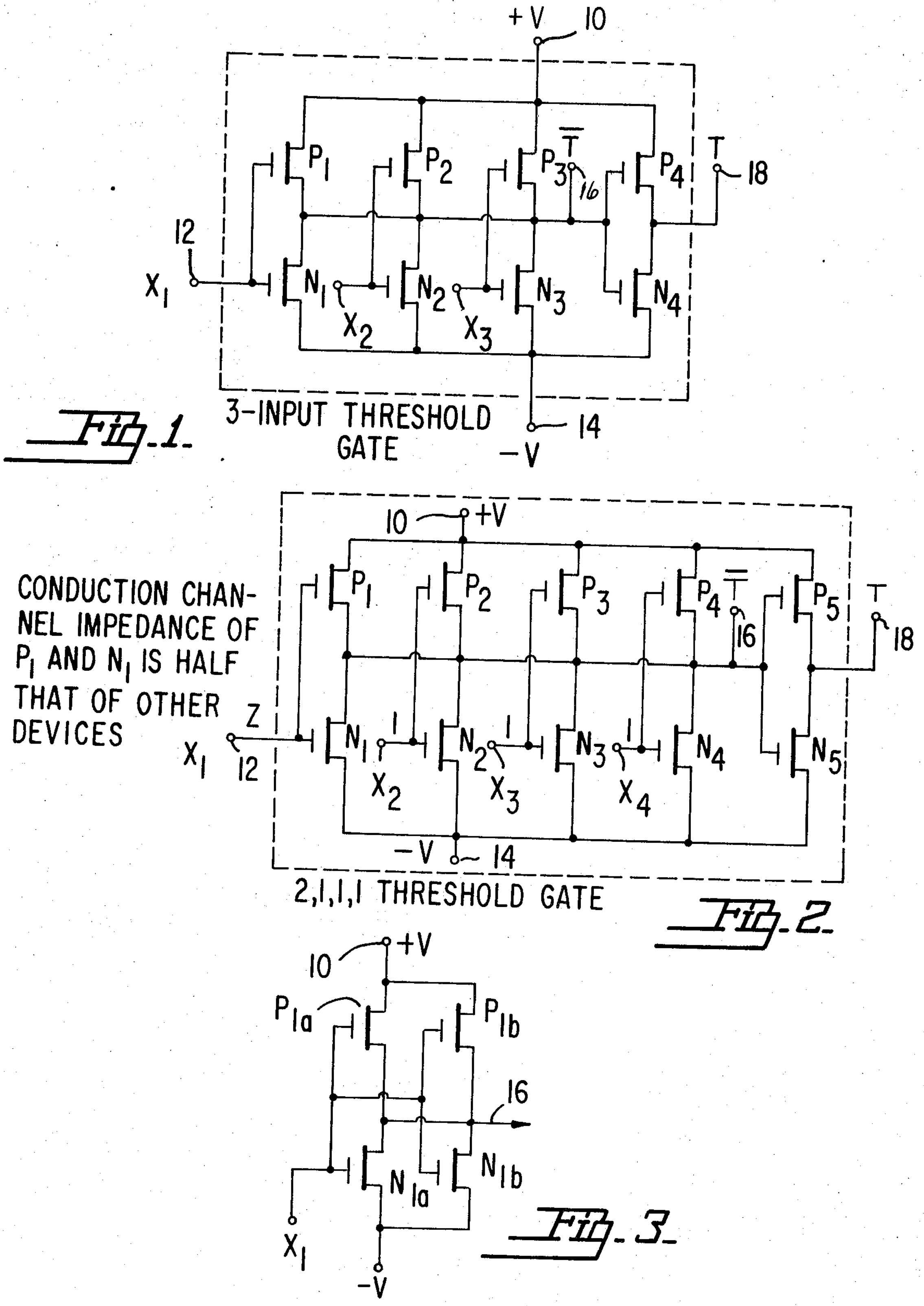
FIG. 1 is a schematic drawing of a three input threshold gate.
FIG. 2 is a schematic drawing of a 2,1,1,1 threshold gate.
FIG. 3 shows a portion of the circuit of FIG. 2 in modified form.

The circuit of FIG. 1 is a three-input threshold gate. It operates as a majority-minority gate when the circuit design is such that the conduction paths of transistors $P_1 - P_3$ and $N_1 - N_3$ are of equal resistance. The circuit includes three complementary-symmetry, metal-oxide semiconductor (CMOS) field-effect transistor inverters for together performing a complemented threshold function such as the minority function, and a fourth inverter for producing a standardized output signal indicative of a "true" or uncomplement threshold function such as the majority function.

The first pair of transistors which is typical of and interconnected similarly to the others, consists of a p-type transistor $P_1$ whose conduction path is in series with that of an n-type transistor $N_1$. Transistor $P_1$ is connected at its source electrode to a +V power supply terminal 10 and at its drain electrode to the drain electrode of transistor $N_1$. The gate electrodes of transistors $P_1$ and $N_1$ are connected to a signal input terminal 12 for a signal $X_1$. The source electrode of transistor $N_1$ is connected to terminal 14 for a source of voltage −V. A single inverter such as this is in itself well-known. It is described, for example, in Burns and Powlus U.S. Pat. No. 3,260,863 assigned to the same assignee as the present application.

In the embodiment of the present invention shown in FIG. 1, the common drain connection of all three transistor pairs connects to a first common output signal terminal 16 of the circuit. The fourth inverter $P_4$, $N_4$ is connected at its common gate connection to terminal 16 and at its common drain connection to the second circuit output terminal 18. The complementary signal $\overline{T}$ is present at terminal 16 and the true signal T is present at terminal 18.

In the discussion which follows of the operation of the circuit of FIG. 1, it is assumed that +V and −V are of the same value such as +5 volts and −5 volts, respectively, and the convention adopted is that any signal which is positive represents a 1 and any signal which is negative represents a 0. Optimally, +V represents a 1 and −V represents a 0. In the present circuit, the value of T always is +V or −V but $\overline{T}$ may be less positive than +V or not as negative as −V, depending on the binary values of $X_1$, $X_2$ and $X_3$.

In the discussion, it is assumed that the conduction paths of transistors $P_1 - P_3$ and $N_1 - N_3$ are all of the same resistance (for a given drain-to-source voltage and given gate-to-source voltage), that is, the circuit is intended to operate as a 3-input majority-minority gate. To start with, it will be assumed that $X_1 = X_2 = X_3 = 1$. Under this set of conditions, transistors $P_1$, $P_2$ and $P_3$ are cut off and their conduction channels exhibit a very high resistance. Transistors $N_1$, $N_2$ and $N_3$ are on — their conduction channels exhibit a low resistance, and an output voltage level $\overline{T} = -V$ indicative of binary 0 appears at terminal 16. This drives transistor $N_4$ to cutoff, transistor $P_4$ conducts and an output level $T = +V$ indicative of binary 1 appears at terminal 18.

It is clear also that when $X_1 = X_2 = X_3 = 0$, $\overline{T} = +V$ indicative of a 1 and $T = -V$ indicative of a 0.

Assume now that $X_1 = X_2 = 1$ and $X_3 = 0$. The $X_1$ and $X_2$ signals, which are positive, cause transistors $N_1$ and $N_2$ to conduct and transistors $P_1$ and $P_2$ to cut off and the $X_3$ signal, which is negative, causes transistor $P_3$ to conduct and transistor $N_3$ to cut off. It may appear on first consideration that the transistors $N_1$ and $N_2$, when they conduct, each exhibit the same conduction path resistance as the transistor $P_3$ when it conducts. However, it will be shown below that this is not quite true. The two n-type transistors each exhibit a lower impedance than the p-type transistor. The reason has to do with the fact that the drain-to-source voltage of transistor $P_3$ is greater than the drain-to-source voltage of transistors $N_1$ and $N_2$. (On the other hand, if the inputs were $X_1 = X_2 = 0$, $X_3 = 1$, the conducting p-type transistors $P_1$ and $P_2$ would exhibit a lower conduction path resistance than the conducting n-type transistor $N_3$.

It may be in order at this point briefly to review the operation of field-effect transistors of the MOS type. Such a transistor, when in the off state, exhibits an extremely high source-to-drain resistance. When in the on state, however, the resistance is not the same for all operating conditions. When the transistor is operating at current saturation, as defined below, or operating at close to current saturation, the resistance of its drain-to-source path is relatively much higher than when the transistor is operating in its so-called "variable resistance" region as also defined below.

A transistor operates in current saturation when further increase in drain-to-source voltage, at a given gate-to-source voltage, does not result in any increase in drain-to-source current. The following equation describes this condition:

$$|V_{DS}| \geqq |V_{GS} - V_T| \quad (1)$$

where $V_{DS}$ = the drain-to-source voltage, $V_{GS}$ = the gate-to-source voltage, and $V_T$ = the threshold voltage of the transistor.

The threshold voltage $V_T$ is smaller than $V$, where $V$ is the operating voltage.

An MOS transistor operates in the variable resistance region when the following conditions exist:

$$|V_{DS}| \leqq |V_{GS} - V_T| \quad (2)$$

Returning now to the example in which $X_1 = X_2 = 1$ and $X_3 = 0$, transistors $N_1$, $N_2$ and $P_3$ conduct, and transistors $P_1$, $P_2$ and $N_3$ are cut off. If it were assumed erroneously that when operating in this way the conduction channels of all conducting devices had the same resistance R, the resistance between terminal 14 and 16 would be (R/2) and the resistance between terminal 16 and 10 would be R. This would mean that the voltage $\overline{T}$ at terminal 16 would be $(-V/3)$ (for the case in which $+V = +5$ volts and $-V = -5$ volts, $\overline{T} = -1\ 2/3$ volts). In practice, as already mentioned, the voltage is substantially more negative than $(-V/3)$. This can be shown by the simplified equations below.

For a conducting transistor such as $N_2$:

$$|V_{GS}| = |+V-(-V)| = |2V| \quad (3)$$

$$|V_{DS}| = |V+(-\overline{T})| \quad (4)$$

as $\overline{T}$ is negative when $X_1 = X_2 = 1$, $$|V_{DS}| < |V| \quad (5)$$

subtracting $V_T$ from both sides of equation (3) gives $$|V_{GS}-V_T| = |2V-V_T| \quad (6)$$

and as $V_T < V$, then $$|V_{GS}-V_T| > V \quad (7)$$

Examination of expressions (5) and (7) make it clear that:

$$|V_{DS}| < |V_{GS}-V_T| \quad (8)$$

This last expression is the criterion for "variable resistance" operation (equation 2 above) and this means that the conduction paths of transistors $N_1$ and $N_2$ each exhibit a relatively low resistance.

For the conducting transistor $P_3$, the drain-to-source voltage is $$|V_{DS}| = |+V-(-\overline{T})| \quad (9)$$

and this clearly is greater than V. For the same transistor, $$|V_{GS}| = |+V-(-V)| = 2V \quad (10)$$

It is clear from equations (9) and (10) that the condition for saturated operation, that is $|V_{DS}| \geqq |V_{GS}-V_T|$ is met if $|V+\overline{T}| > |2V-V_T|$. With proper circuit design, that is, proper choice of $V_T$, this condition easily is met. And, in any case, it is clear that because the source-to-drain voltage across transistor $P_3$ is greater than that across transistors $N_1$ and $N_2$, conducting transistor $P_3$ is operating closer to saturation than either of conducting transistors $N_1$ or $N_2$, and $P_3$'s source-to-drain resistance is substantially higher than that of either transistor $N_1$ or $N_2$.

The last inverter $P_4$, $N_4$ produces an output $T$ indicative of the complement of its input $\overline{T}$. In the present example, $X_1 = X_2 = 1$ and $X_3 = 0$, $\overline{T}$ represents a 0 (is negative) and $T$ represents a 1 (is positive). As in the previous example, $T$ always is at one of the standard voltage levels, that is, either at $+V$ or $-V$. As $\overline{T}$ is the minority function of three variables, $T$ clearly is the majority function of the same three variables.

While in the embodiment of the invention shown in FIG. 1 there are three input quantities, the principle of operation is valid for any odd number of input variables. For example, if there were five variables, there would be five transistor pairs for producing the $\overline{T}$ signal and an additional pair for producing the $T$ signal. In the circuit of FIG. 1, the conduction channels of all devices which produce the minority function should have roughly the same value of resistance, when conducting, for a given $V_{DS}$ and $V_{GS}$. Moreover, it is preferred, in the interest of reducing power dissipation, that the conduction channel impedances, when the transistors conduct, be relatively high.

For the purposes of illustration, it is assumed in the discussion above that $|+V| = |-V|$. In practice, this need not be the case. For example, $+V$ may be some value such as +10 volts and $-V$ may be at ground. In a three-input circuit of this latter type which was built, the actual voltages present were those shown in Table I below; in a five-input circuit of this type, the voltages were as shown in Table II below.

TABLE I

| No. of Inputs High Binary 1 | Output Voltage T, in Volts | Represents Binary | Voltage Difference From Optimum Value, in Volts |
|---|---|---|---|
| 0 | 10 | 1 | 0 |
| 1 | 8.4 | 1 | −1.6 |
| 2 | 1.7 | 0 | +1.7 |
| 3 | 0 | 0 | 0 |

TABLE II

| No. of Inputs High Binary 1 | Output Voltage T, in Volts | Represents Binary | Voltage Difference From Optimum Value, in Volts |
|---|---|---|---|
| 0 | 10 | 1 | 0 |
| 1 | 9.2 | 1 | −0.8 |
| 2 | 7.7 | 1 | −2.3 |
| 3 | 2.4 | 0 | +2.4 |
| 4 | 0.7 | 0 | +0.7 |
| 5 | 0 | 0 | 0 |

A feature of the circuit of FIG. 1 is that it is easy to integrate and is compatible with other integrated MOS circuits. In practice, in the interest of simplifying the manufacture, the transistors $P_4$ and $N_4$ may have conduction channels of the same impedance (for a given $V_{GS}$ and $V_{DS}$) as the other conduction channels, although this need not necessarily be the case.

It already has been mentioned that the voltage present at terminal 16 may have a value different than $+V$ or $-V$. In these cases, a standardized signal may be obtained from the circuit, which signal will have the same binary significance as the signal at 16, by connecting an additional complementary-symmetry inverter to terminal 18. However, in many circuit applications such standardization of signal level is not essential.

The circuit of FIG. 1 has been discussed in terms of a simple three-input majority-minority gate, that is, a circuit which has $N$=3 inputs, each input having the same weight, namely, 1, and the circuit having a threshold of $(M+1)$ 2=2, where $M$ is the total number of input weights and is equal to 3×1=3. The principles of the invention are equally applicable to the implementation of weighted threshold logic functions. For example, the circuit of FIG. 2 performs the 2,1,1,1 threshold function. In this circuit, the conduction channels of transistors $P_1$ and $N_1$ have half the resistance of the conduction channels of the other devices for a given $V_{GS}$ and given source-to-drain voltage $V_{SD}$. Known techniques may be employed to provide this reduced channel resistance. For example, the resistance of half value (R/2) may be provided by making the conduction channel of $P_1$ twice as wide as the conduction channel of any of $P_2$, $P_3$ or $P_4$ and similarly the conduction channel of $N_1$ may be made twice as wide as that of the other n-type transistors. The conduction channels of transistors $P_2$, $P_3$, $P_4$, $N_2$, $N_3$ and $N_4$ should all have the same value of resistance (R) for the given $V_{GS}$ and given $V_{DS}$.

In the operation of the circuit of FIG. 2, the signal $X_1$ will have twice the effect on the circuit operation as any of the signals $X_2$, $X_3$ or $X_4$. For example, if $X_1$ and $X_2$ represent the bit 1, then $\overline{T}$ will represent a 0 regardless of the value of the other signals $X_3$ and $X_4$. On the other hand, if $X_2$, $X_3$ and $X_4$ represent the bit 1, then $\overline{T}$ will represent a 0 regardless of the value of $X_1$. As in the previous circuit, $T$ has a value complementary to $\overline{T}$. In logical terms, the FIG. 2 circuit is an $N$=4 input threshold gate circuit. One of the inputs has a weight 2 and each of the other inputs has a weight 1, and the circuit has a threshold of $(M+1)/2$=3, where $M$ is the total number of input weights and is equal to 2+3×1=5.

It is sometimes desirable for the sake of ease of manufacture that all transistors employed be of the same dimensions, that is, that all conduction channels exhibit the same resistance for a given $V_{DS}$ and given $V_{GS}$. The modification of FIG. 3 permits this to be done. Here, to obtain an input of weight two, two inverters are connected in parallel, as shown. In other words, the four gate electrodes of $P_{1a}$, $P_{1b}$, $N_{1a}$, and $N_{ab}$ are all connected to a common input terminal to which a signal such as $X_1$ is applied, the conduction paths of both inverters are connected in parallel between the $+V$ and $-V$ power supply terminals, and the drain electrodes are connected to common output terminal 16. Now, if each conduction path has a resistance R for a given $V_{DS}$ and $V_{GS}$ and, for example, $X_1$ is negative, then transistors $P_{1a}$ and $P_{1b}$ are both turned on and the effective resistance between terminal 10 and common output connection 16 is (R/2) for the given $V_{DS}$ and $V_{GS}$.

In the examples above, the invention is illustrated by showing weight 1 input terminals and weight 2 input terminals. Of course, other input weights are possible and feasible. For example, by placing three transistor inverters in parallel, a weight 3 input circuit may be simulated. Four transistor inverters in parallel simulate a weight 4 input circuit and so on. Similarly, in the FIG. 2 circuit, the conduction channels of a pair such as $P_2$, $N_2$ or any other pair may have resistances one-third that of other resistances and so on. The only circuit limitation in this area is that the circuit design be such that the value of voltage at the $\overline{T}$ terminal 16 always be some value which provides an unambiguous indication of a 1 or 0. This condition is met, for example, when the sum of the input weights is an odd number.

What is claimed is:

1. An $N$ input threshold gate circuit, each such input having a given weight, and said circuit having a threshold $(M+1)/2$), where $M$ is the total number of input weights of the circuit and is an odd integer comprising, in combination:

$N$ complementary-symmetry, field-effect transistor inverter circuits, each inverter circuit comprising the series connected conduction paths of a pair of opposite conductivity type field-effect transistors connected between operating voltage terminals, where $N$ is an integer greater than 1;

$N$ input terminals, each terminal connected to the gate electrodes of a different pair of said transistors; and a signal output terminal comprising a single connection common to the entire circuit connected to all series paths at the point along each path where the transistor of one conductivity type joins the transistor of other conductivity type, said threshold gate circuit producing at said output terminal a signal representing one binary value when the binary inputs represented by voltages applied to said input terminals have binary values such that the threshold of the circuit is not reached, and producing a signal representing the other binary value when said binary inputs have binary values such that the threshold of the circuit is reached or exceeded.

2. In the combination as set forth in claim 1, one inverter circuit comprising two field-effect transistors, each having a conduction channel of resistance (R/H) at a given drain-to-source voltage $V_{DS}$ and one other field-effect transistor inverter circuit having two field-effect transistors each with a conduction channel resistance of R at said given $V_{DS}$ where H is an integer greater than 1.

3. In the combination as set forth in claim 1, at least one of said field-effect transistor inverter circuits comprising a first series connected conduction path of a pair of opposite conductivity type field-effect transistors connected between operating voltage terminals and a second series connected conduction path of a pair of opposite conductivity type field-effect transistors connected in parallel with the first path, the four gate electrodes of these four transistors being connected to a common circuit point and serving as a signal input terminal and these two paths being connected to a common output signal terminal at each connection between a transistor of one conductivity type and a transistor of opposite conductivity type.

4. In the combination as set forth in claim 1, further including one additional field-effect transistor inverter circuit comprising the series connected conduction paths of a pair of opposite conductivity type, field-effect transistors connected between said operating voltage terminals, the two gate electrodes of said transistors being connected to said signal output terminal and the point along said series connected conduction paths where the transistor of one conductivity type is joined to the transistor of other conductivity type comprising a second signal output terminal.

5. A threshold gate as set forth in claim 1 wherein the field effect transistors of each inverter circuit have conduction channels of the same resistance at a given drain-to-source voltage and *N* is an odd integer greater than 1.

* * * * *